(12) United States Patent
Siessegger et al.

(10) Patent No.: US 9,998,026 B2
(45) Date of Patent: Jun. 12, 2018

(54) TECHNIQUES FOR ASSESSING CONDITION OF LEDS AND POWER SUPPLY

(71) Applicants: OSRAM SYLVANIA INC., Danvers, MA (US); Bernhard Siessegger, Danvers, MA (US); Marijan Kostrun, Newbury, MA (US)

(72) Inventors: Bernhard Siessegger, Danvers, MA (US); Marijan Kostrun, Newbury, MA (US)

(73) Assignee: OSRAM SYLVANIA Inc., Wilmington, WA (US)

( * ) Notice: Subject to any disclaimer, the term of this patent is extended or adjusted under 35 U.S.C. 154(b) by 403 days.

(21) Appl. No.: 14/373,227

(22) PCT Filed: Jan. 21, 2013

(86) PCT No.: PCT/US2013/022382
§ 371 (c)(1),
(2) Date: Jul. 18, 2014

(87) PCT Pub. No.: WO2013/110027
PCT Pub. Date: Jul. 25, 2013

(65) Prior Publication Data
US 2014/0368204 A1     Dec. 18, 2014

Related U.S. Application Data

(60) Provisional application No. 61/588,838, filed on Jan. 20, 2012.

(51) Int. Cl.
*G01R 31/44* (2006.01)
*H02M 7/06* (2006.01)
(Continued)

(52) U.S. Cl.
CPC ............ *H02M 7/06* (2013.01); *H01L 25/167* (2013.01); *H01L 27/156* (2013.01); *H01L 33/62* (2013.01);
(Continued)

(58) Field of Classification Search
CPC ............ H05B 33/0803; H05B 33/0806; H05B 33/0827; H05B 33/0848; H05B 33/0884;
(Continued)

(56) References Cited

U.S. PATENT DOCUMENTS

2008/0203936 A1   8/2008  Mariyama et al.
2009/0267528 A1   10/2009  Nijhof et al.
(Continued)

FOREIGN PATENT DOCUMENTS

JP    2009 539220    11/2009
JP    2010-080906    4/2010
(Continued)

OTHER PUBLICATIONS

PCT Search Report, dated May 15, 2013.

*Primary Examiner* — Alesa Allgood
*Assistant Examiner* — Brent J Andrews
(74) *Attorney, Agent, or Firm* — Yutian Ling

(57) ABSTRACT

Techniques are disclosed for assessing the conditions of LEDs and power supplies of solid state lighting systems. The techniques can be used, for example, to measure the capacitance of an output capacitor C in a switch-mode power supply (SMPS), and to measure the condition of the LEDs being driven by that power supply. In some cases, this assessment can be implemented in a lighting controller that controls the lighting system, which may be configured to simultaneously determine C and the conditions of LEDs. In one example case, the techniques can be implemented, for instance, in a micro-controller operating the lighting system.

(Continued)

A lighting system implementing the techniques can be periodically assessed so as to provide real-time diagnostic capability. Numerous example embodiments of SMPS LED lighting systems will be apparent in light of this disclosure.

17 Claims, 3 Drawing Sheets

(51) Int. Cl.

| | |
|---|---|
| *H05B 37/02* | (2006.01) |
| *H05B 33/08* | (2006.01) |
| *H01L 25/16* | (2006.01) |
| *H05B 41/39* | (2006.01) |
| *H01L 27/15* | (2006.01) |
| *H01L 33/62* | (2010.01) |
| *H01L 25/075* | (2006.01) |
| *G01R 31/26* | (2014.01) |
| *G01R 31/40* | (2014.01) |
| *G01R 31/02* | (2006.01) |

(52) U.S. Cl.
CPC ....... *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/02* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

(58) Field of Classification Search
CPC ............ H05B 33/0812; H05B 33/0815; H05B 33/0821; H05B 33/083; H05B 33/0845; H05B 33/086; H05B 33/0893; H05B 37/0209; H05B 41/39; H02M 7/06; H01L 25/167
See application file for complete search history.

(56) References Cited

U.S. PATENT DOCUMENTS

| | | | |
|---|---|---|---|
| 2010/0045210 A1* | 2/2010 | Hariharan | H05B 33/0815 315/297 |
| 2010/0086758 A1 | 4/2010 | Takase et al. | |
| 2010/0156319 A1* | 6/2010 | Melanson | H05B 33/0839 315/297 |
| 2011/0030381 A1 | 2/2011 | Sordyl et al. | |
| 2011/0057573 A1* | 3/2011 | Jutras | H05B 33/083 315/185 R |
| 2011/0109614 A1 | 5/2011 | Wang | |
| 2012/0098430 A1* | 4/2012 | Inoue | H05B 33/0893 315/82 |
| 2012/0105228 A1* | 5/2012 | Loveland | H05B 33/0803 340/540 |

FOREIGN PATENT DOCUMENTS

| | | |
|---|---|---|
| KR | 10 2008 0080012 | 9/2008 |
| KR | 10-2011-0052406 | 5/2011 |
| KR | 10 2011 0110374 | 10/2011 |

* cited by examiner

US 9,998,026 B2

TECHNIQUES FOR ASSESSING CONDITION OF LEDS AND POWER SUPPLY

RELATED APPLICATIONS

This application is a U.S. National Stage application of, and claims the benefit of, International Application PCT PCT/US2013/022382, filed Jan. 21, 2013, which claims the benefit of Provisional Application No. 61/588,838, filed Jan. 20, 2012. Each of these applications is herein incorporated by reference in its entirety.

FIELD OF THE DISCLOSURE

The present application relates to lighting systems, and more specifically to techniques for assessing conditions of LEDs and their power supply.

BACKGROUND

Light emitting diodes (LEDs) are increasingly used for illumination in residential and commercial environments instead of classical sources of light such as incandescent or fluorescent lamps. Unlike earlier sources of light, LEDs typically appear as a part of a larger system, sometimes referred to as a solid-state lighting (SSL) system. Two main sub-systems included in an SSL system are the LEDs and their power supply. A frequently used topology of the power supply is the so called switch-mode power supply (SMPS). There are a number of non-trivial issues associated with such lighting systems.

DETAILED DESCRIPTION

Techniques are disclosed for assessing the conditions of LEDs and power supplies of solid state lighting systems. The techniques can be used, for example, to measure the capacitance of an output capacitor C in a switch-mode power supply (SMPS), and to measure the condition of the LEDs being driven by that power supply. In some cases, this assessment can be implemented in a lighting controller that controls the lighting system, which may be configured to simultaneously determine C and the conditions of LEDs. In one example case, the techniques can be implemented, for instance, in a micro-controller operating the lighting system. A lighting system implementing the techniques can be periodically assessed so as to provide real-time diagnostic capability. Numerous example embodiments of SMPS LED lighting systems will be apparent in light of this disclosure.

General Overview

Figure 1A:
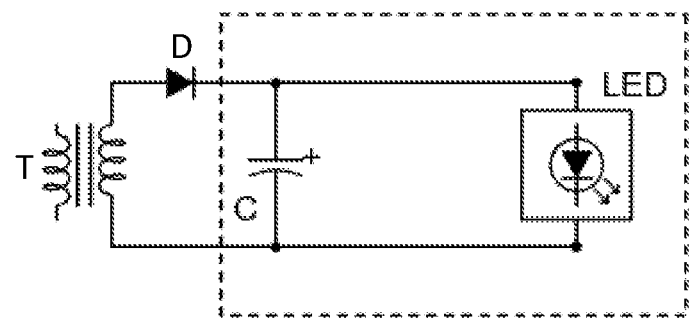
FIGS. 1a and 1b schematically illustrate example solid-state lighting systems and their respective main electric subsystems.
Figure 1B:
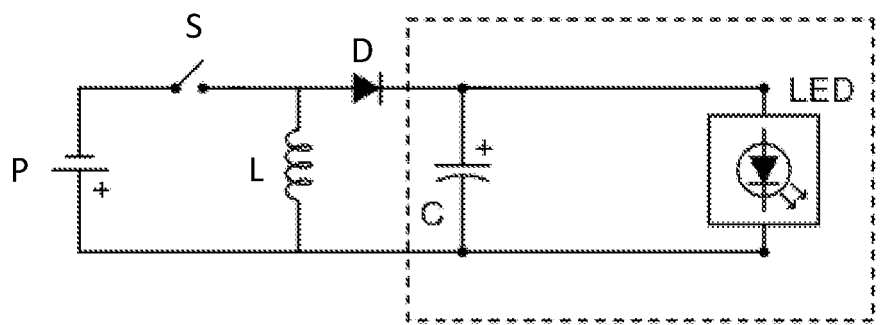

As previously noted, there are a number of non-trivial issues associated with switch-mode power supply (SMPS) based lighting systems. For example, in a properly designed SMPS, one of the electronic components that has a significant effect on the functioning of the SMPS is an electrolytic capacitor at the output. This capacitor is used as a filter to reduce the variations in voltage and current that is being supplied to the LEDs. FIGS. 1a and 1b show example solid-state lighting (SSL) systems that utilize an SMPS to power an LED and are configured with a capacitor C as the output filter. FIG. 1a illustrates a so-called flyback SMPS topology, which can be configured for AC/DC and DC/DC conversion and employs transformer T to provide galvanic isolation between the input and any outputs. FIG. 1b illustrates a so-called buck-boost SMPS topology, which can be configured for DC/DC conversion and employs an inductor L and switch S T to provide the output voltage. In both topologies, diode D can be used to prevent current from flowing back into the source. While individual LEDs are generally known to be very reliable and long lived, a single LED cannot deliver much power. Thus, SSL systems typically employ large number of LEDs, wherein the LEDs are serially connected LED to form one or more so-called LED strings.

Figure 2:
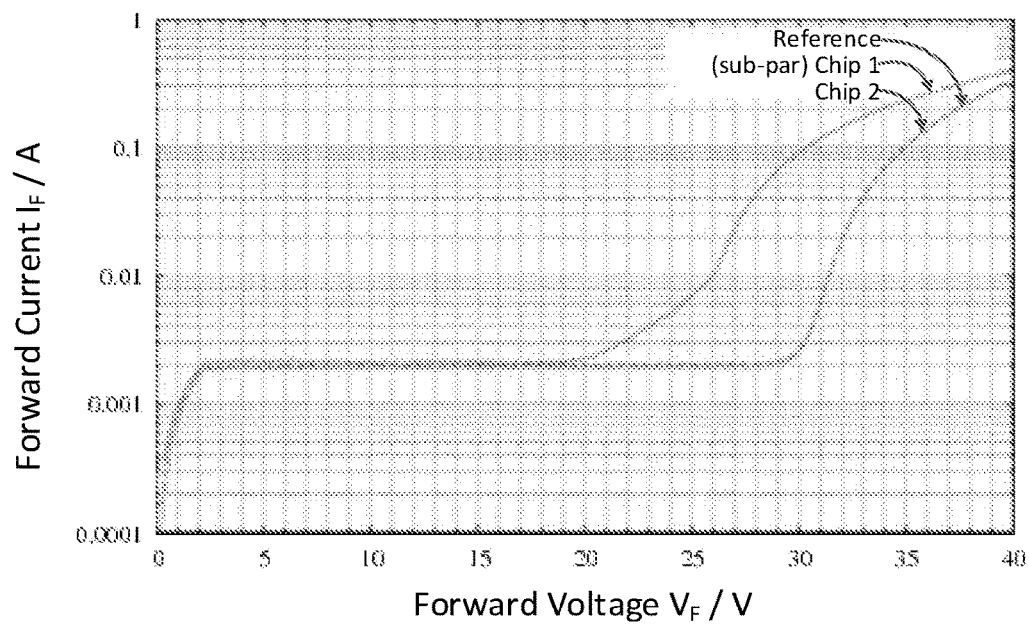
FIG. 2 is a graph illustrating the voltage-current (VI) characteristic of two LEDs of the same topology, type and number of LEDs, and further showing sub-par performance for one of the LEDs.

A problem with such SSL systems is how to assess the condition and aging of a given system. To this end, sub-systems such as those shown in FIGS. 1a-b generally change with operating time, or age, under normal operating conditions. In more detail, the electrical properties of an electrolytic capacitor are its capacitance C, and its equivalent series resistance (ESR). For a capacitor free of manufacturing defects, capacitance C decreases while ESR increases, both as a function of operating conditions. Operating conditions that are particularly relevant here include the core temperature and the ripple current. One reason why such changes in performance occur is that the electrolyte in the capacitor C evaporates at a rate influenced by the operating conditions. Compared to aging defect-free capacitors, the aging of the LEDs free of manufacturing defects involves more complex physical processes mostly occurring in their active layer, and surrounding structures. The LEDs efficiency drops with the increase in the number of defects, and as these defects move around. These defects decrease the efficiency of the LEDs, for example, by increasing the likeliness of non-radiative recombinations for the injected electrons and holes. Both processes are created and strongly affected by the electric current passing through the active layer, and by the operating temperature of the active layer, and are unavoidable. FIG. 2 is a graph illustrating the voltage-current (VI) characteristic of two LEDs of the same topology, type and number of LEDs, one LED healthy and the other somewhat degraded. One way of characterizing a healthy LED is a threshold voltage $V_{TH}$, below which the forward current drops below some predefined threshold current $I_{TH}$. As can be seen, Chip 2 nicely tracks the reference and is healthy, with a threshold voltage $V_{TH}$ of about 29 V for a threshold current $I_{TH}$ of about 2 mA. On the other hand, Chip 1 is degraded, as manifested in its $V_{th}^*$ of about 18 V for the same $I_{TH}$, where $V_{th}^*$ is less than $V_{TH}$. Thus, the degraded Chip 1 conducts electricity well even below $V_{TH}$.

Thus, and in accordance with an embodiment of the present invention, information that is useful in determining the conditions and aging of a SSL system includes the value of capacitance C, and the estimate on the degradation of the LEDs. In some embodiments, degradation of the LEDs can be determined through one of the following methods: the threshold voltage of the LED chip $V_{TH}$; the VI curve of the LEDs; the capacitor discharge current as a function of time; or the voltage across LED chip as a function of time. Such information can be periodically collected and used to assess system health, in accordance with an embodiment of the present invention. Real-time diagnostics can thus be provided, and lighting systems exhibiting sub-par performance can be flagged for preventative maintenance. In some embodiments, notifications of such sub-par performance can be automatically generated and sent to maintenance personnel.

Lighting System Diagnostics

Figure 3:
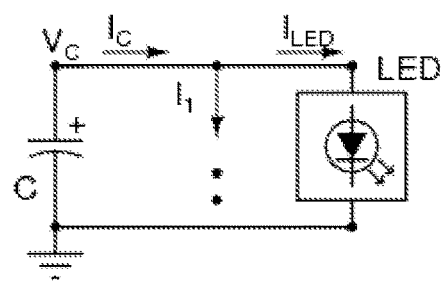
FIG. 3 schematically illustrates a simplified electric circuit representing the output capacitor and the LEDs immediately after a given SSL system has been switched off.

FIG. 3 schematically illustrates a simplified electric circuit representing the output capacitor and the LEDs immediately after a given SSL system has been switched off (such as the case when the external power has been turned off or disconnected). Initially, the capacitor is charged to some voltage $V_C$, which is greater than the threshold voltage $V_{TH}$ of the LEDs. The capacitor discharges through the LEDs with current $I_{LED}$ and possibly through other paths (shown in FIG. 3 is one possible example path with current $I_1$). In this case, $V_C$ can be computed as follows:

$$V_C = \frac{Q}{C} \qquad \text{(Equation 1)}$$

so the discharge equation for the capacitor is:

$$\dot{V}_C = \frac{\dot{Q}}{C} = -\frac{I_C}{C} \qquad \text{(Equation 2)}$$

where the dot near the quantity ($V_C$ and Q, in this case) implies its time differentiation. To solve Equation 1, the quantities $I_C=I_1+I_{LED}$ (+ any other known currents) are used, as they determine the rate of discharge of the capacitor C.

Detecting the Switch-Off Time

Figure 4:
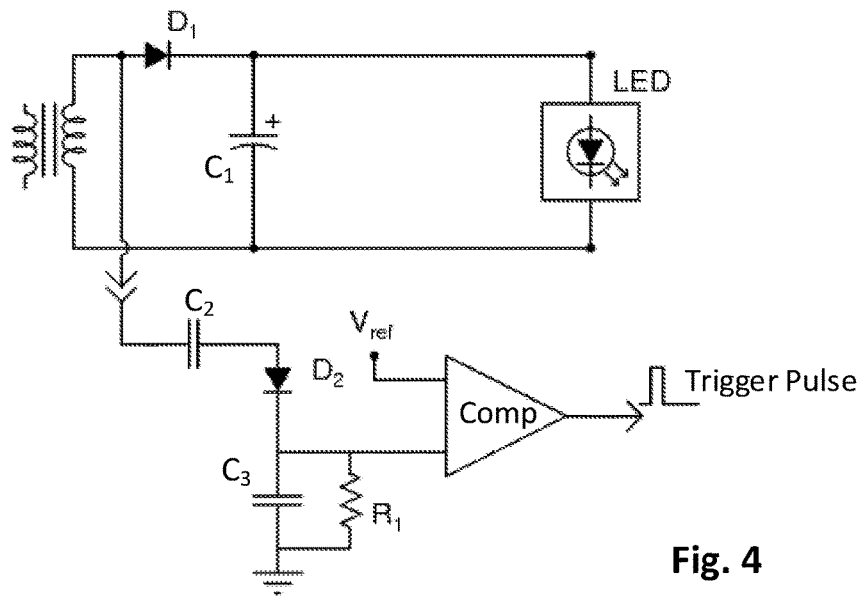
FIG. 4 illustrates an example circuit that can be used for detecting the switch-off time in a switch-mode power supply, in accordance with one such embodiment.

Assessing the conditions of an SSL system can be carried out using knowledge of the time when the system was switched off, in accordance with an embodiment of the present invention. To this end, FIG. 4 illustrates an example circuit that can be used for detecting the switch-off time in a switch-mode power supply, in accordance with one such embodiment. The switch-mode power supply in this example case is a flyback converter. As can be seen, the circuit produces a trigger pulse which can be used as a control signal that indicates it is time to start following the discharge of capacitor $C_1$. The control signal can be received, for example, by a micro-controller (any suitable processor) that controls the lighting system and which in turn can be programmed or otherwise configured to start following the discharge of $C_1$ in response to that control signal.

In operation, the off-time detection circuit of this example embodiment receives its input signal from the anode of the rectifier diode $D_1$. The input voltage comprises high-frequency spikes at the switching frequency, which is typically of the order of few hundred kHz but may vary from embodiment to embodiment. This signal passes through a high-pass filter comprised of the capacitor $C_2$, rectified by the diode $D_2$, and filtered at $R_1$ $C_3$, before being compared to a reference voltage $V_{ref}$ by comparator Comp. If the so processed signal is greater than $V_{ref}$ then the SMPS is considered to be in active (switched on) state. However, when this signal drops below $V_{ref}$, the SMPS is considered to be inactive (switched off). In response, the comparator issues a trigger pulse which can be used to activate the next part of the circuit, which controls the SSL.

As previously explained, this control portion of the circuit may be implemented, for example, as a micro-controller or any other suitable processor or processing circuitry that is employed to control the SSL. In such example cases, the control circuitry may be responsible for data collection such as LED voltage and capacitor $C_1$ current, from which the conditions of the SSL system can then be assessed. The control circuitry may also be programmed or otherwise configured to make this assessment of the SSL. The assessment performed by the control circuit will generally depend on factors such as from where the power supply for the controller is taken.

Data Collection

Figure 5:
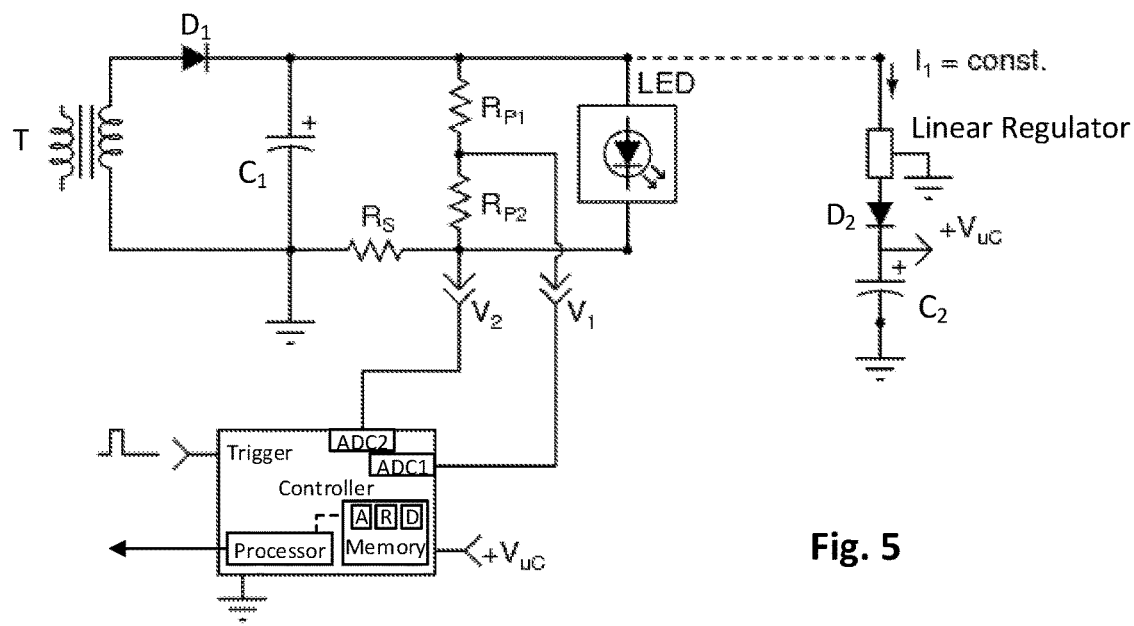
FIG. 5 schematically illustrates an example circuit for collecting data that can be used in assessing an SSL, in accordance with an embodiment of the present invention.

FIG. 5 schematically illustrates an example circuit for collecting data that can be used in assessing an SSL, in accordance with an embodiment of the present invention. The data can vary from one embodiment to the next, as will be appreciated in light of this disclosure, but in one example embodiment includes the voltage across the LEDs and the discharge current of the capacitor $C_1$. As can be seen in this example embodiment of FIG. 5, the power supply for the controller acts as a constant current drain with current $I_1$. The controller can be, for instance, a micro-controller of the SSL or a dedicated processor provisioned specifically for assessing the SSL as described herein.

In operation, when the controller receives the trigger signal from the switch-off detection circuit, it starts to collect voltage and current data. As can be further seen with respect to the example embodiment of FIG. 5, the controller receives its power from a circuit that includes a linear regulator, diode $D_2$ and another capacitor $C_2$. For purpose of this discussion, assume that this controller power supply circuit acts as a constant current drain connected in parallel with the capacitor $C_1$, which current is $I_1$ and is a known quantity. As can be further seen, the data is collected through two analog-to-digital converters, ADC1 and ADC2, which are implemented in the controller. Specifically, ADC1 and ADC2 read voltages $V_1$ and $V_2$, respectively. The voltage $V_1$ corresponds to the voltage across LEDs through relationship, $$V_{LED}=[(R_{p1}+R_{p2})/R_{p2}]V_1 \qquad \text{(Equation 3)}$$

while the voltage $V_2$ corresponds to the capacitor discharge current through the relationship, $$I_C = \frac{V_2}{R_S} \qquad \text{(Equation 4)}$$

From here, the current through LEDs can be determined, $$I_{LED}=I_C-I_1. \qquad \text{(Equation 5)}$$

As can be further seen with reference to the example embodiment of FIG. 5, the controller is configured with a processor and a memory includes include a storage area (D) for storing data to be used in the SSL system assessment. The memory also includes a number of modules stored therein that can be accessed and executed by the processor. The modules include an analysis module (A) and a reporting module (R). These modules can be implemented, for example, in any suitable programming language (e.g., C, C++, objective C, custom or proprietary instruction sets, etc), and encoded on a machine readable medium, that when executed by the processor, carries out reporting and/or analysis functionality as described herein. Other embodiments of the controller can be implemented, for instance, with gate-level logic or an application-specific integrated circuit (ASIC) or purpose built semiconductor, or a microcontroller having a number of embedded routines for carrying out the device functionality and input/output capability (e.g., inputs for receiving measured SSL system parameters and outputs for reporting SSL system health or switching in redundant circuitry to replace lighting circuitry that is performing sub-par). In short, the controller can be implemented in hardware, software, firmware, or a combination thereof.

As will be appreciated in light of this disclosure, the micro-controller (or other control circuit) configuration can depend on from where the power supply for the micro-controller is taken. In one example case, as shown in FIG. 5, the power for the micro-controller is taken from the same capacitor that is being monitored for health, so in this case knowing the current $I_1$ is necessary, the drain current of the linear regulator that acts as a power supply for the micro-controller. This mode of application may be useful, for example, for replacement LED lamps and such. Another example case, for which FIG. 5 also applies, but the power for the micro-controller is taken from the DC mains that supply the power to the SMPS. In that case the SMPS is always powered but the light output depends on the external controller (e.g., through Zigbee or DALI or other suitable control protocols). Here, the linear regulator subsystem is absent and the current $I_1$ is zero, and can be neglected or otherwise ignored in what follows.

Thus, and in accordance with an embodiment of the present invention, a micro-controller or other suitable controller circuit having processing capability can collect or otherwise receive data necessary to make the desired assessments, and store that data in memory (e.g., RAM and/or flash memory, or any suitable volatile and/or non-volatile memory), and analyzing that data to assess the SSL. In some embodiments, upon completion of the assessment, notifications of any detected sub-par performance can be automatically generated and sent to maintenance personnel, such as via email or text messaging, through the reporting module of the controller.

Assessing Conditions of LEDs and Capacitor

As previously explained, degradation of the LEDs can be determined through one of the following methods: the threshold voltage of the LED chip $V_{TH}$; the VI curve of the LEDs; the capacitor discharge current as a function of time; or the voltage across LED chip as a function of time. Such information can be periodically collected and stored in controller memory and used to assess SSL system health, in accordance with an embodiment of the present invention. Real-time diagnostics can thus be provided, and SSL systems exhibiting sub-par performance can be flagged for preventative maintenance, which may include automatically switching in a redundant SSL circuit to replace a flagged SSL circuit. A number of example methods for assessing LEDs will now be discussed in turn.

Test A: Threshold Voltage of the LEDs.

With respect to assessing $V_{TH}$ in accordance with one embodiment of the present invention, it is assumed that the LEDs are not catastrophically damaged. In one such example case, the controller (e.g., micro-controller or other suitable circuitry) can be programmed or otherwise configured to measure the current $I_C$ at regular intervals, and when that current approaches conveniently chosen current $I_C^* \geq I_1$ within specified limit $\epsilon^*$ as generally indicated by, $$I_C(t^*) = I_C^* + \epsilon^* \qquad \text{(Equation 6)}$$

the controller measures the voltage $V_1$ shortly thereafter (e.g., within 1 millisecond, or other appropriate delay), and then once more. These values can be referred to as $V_1(t^*+\Delta t)$ and $V_1(t^*+2\cdot\Delta t)$, respectively. Then, the voltage $V_1(t^*+\Delta t)$ is the proxy for the LEDs threshold voltage $V_{TH}$ through the relationship indicated by Equation 3, while the capacitance can be estimated from $$C \simeq (I_C^* \Delta t)/[V_1(t^*+\Delta t) - V_1(t^*+2\cdot\Delta t)]. \qquad \text{(Equation 7)}$$

These two values can be stored in the controller memory (e.g., flash or other non-volatile memory). The controller can also store the two values it has measured after the SSL system was switched off for the first time, and may keep them for lifetime of the system for historical reference, in accordance with some embodiments. As will be appreciated in light of this disclosure, note that a precise knowledge of switch-off time is not necessary (e.g., within a few milliseconds is sufficient).

Test B: LEDs VI Curve (Full and Partial).

For the purpose of assessing the condition of the LEDs it may be impractical to collect a full VI curve, but the following discussion with respect to a full VI curve embodiment is provided for completeness of description, followed by a partial VI curve embodiment.

Test B: Full VI Curve for LEDs.

The controller can be configured to collect data at fixed time intervals $t_i = i \cdot \Delta t$, in accordance with one example embodiment. The data collection can be organized as follows. For even indices $i = 0, 2, 4, \ldots$ the controller reads the voltages $V_1$ (proxy for $V_{LED}$), while for odd indices $i = 1, 3, \ldots$ the controller reads the voltages $V_2$ (proxy for $I_C$). The VI curve can then be constructed as follows. Given values $V_1(2i-1)$ and $V_2(2i)$, from which the complete VI curve is constructed through following manipulations indicated in Table 1.

TABLE 1

| $V_1$ | $V_2$ | $V_{LED} = V_1$ | $I_{LED} = V_2/R_s - I_1$ |
|---|---|---|---|
| $V_1(0)$ | — | — | — |
| — | $V_2(1)$ | ½ ($V_1(0) + V_1(2)$) | $V_2(1)$ |
| $V_1(2)$ | — | $V_1(2)$ | ½ ($V_2(1) + V_2(3)$) |
| — | $V_2(3)$ | ½ ($V_1(2) + V_1(4)$) | $V_2(3)$ |
| $V_1(4)$ | — | $V_1(4)$ | ½ ($V_2(3) + V_2(5)$) |
| … | … | … | … |

The capacitance C can be determined from the first three entries in the table, $$C = -\frac{I_C}{\dot{V}_C} = \left(\frac{\Delta t}{R_S}\right) \frac{V_2(1)}{V_1(0) - V_1(2)} \qquad \text{(Equation 8)}$$

where the prefactor in the brackets is known, and can be omitted in processing, in accordance with one example embodiment.

Test B: Partial VI Curve for LEDs:

A number of $I_{LED}$ values can be chosen, $I_{LED}(k)$, for $k = 1, \ldots K$, and their representative values $V_2(k)$ calculated based on $R_s$ and $I_1$. However, the last value of the current is chosen so that $V_2(K)$ corresponds to the LED current $I_C^* - I_1$. In one example embodiment, the controller can be configured to monitor the voltage $V_2$ and when it crosses any of the values $V_2(k)$, the controller is further configured to measure the voltage $V_1(k^*)$, where $k^*$ indicates that the value is recorded somewhat later in time (e.g., within 1 to 2 milliseconds, or other appropriate delay). The partial VI curve is comprised of the pairs of values $\{V_1(k^*), V_2(k)\}_{k=1,K}$. The last current in the array of measured currents is an approximation for $I_{LED}=I_C^*-I_1$. From there the processing can proceed as discussed in Test A above to determine the threshold voltage $V_{TH}$ and C. The VI curve, the threshold voltage $V_{TH}$, and the capacitance C can be stored in memory of the controller. The controller may also store the values it has measured after the SSL was switched off for the first time, and keeps them for lifetime of the system. Again, note that in this example approach a precise knowledge of switch-off time is not necessary.

Test C: Capacitor Discharge Current $I_C$ as a Function of Time.

This test can be carried out, for example, by configuring the controller to record $V_2$ at regular time intervals $\Delta t$, until $I_C \approx I_C^*$. At that time, the process testing can revert to Test A to measure the threshold voltage and the capacitance. The curve comprises of the pairs of values $\{k \Delta t, V_2(k)\}_{k=1,K}$, together with $V_{TH}$ and C. Here, note that the time information can be omitted as this data is known once the controller is programmed to perform these operations, in accordance with some embodiments of the present invention. Here, note that this methodology can be carried out with precise knowledge of switch-off time (e.g., less than 0.5 milliseconds, or other acceptable tolerance), as this can be important when comparing the last data set to the one previously stored.

Test D: $V_{LED}$ as a Function of Time: This test method can be carried out, for example, by configuring the controller to record $V_1$ at regular time intervals, $\Delta t$, again until $I_C \approx I_C^*$. At that time the testing reverts to the Test A to measure the threshold voltage and the capacitance. The curve comprises of the pairs of values $\{k \Delta t, V_1(k)\}_{k=1,K}$, together with $V_{TH}$ and C. Again, note that the time information can be omitted as this data is known once the controller is programmed to perform these operations, in accordance with some embodiments of the present invention. Here, note that this methodology requires precise knowledge of switch-off time (e.g., less than 0.5 milliseconds, or other acceptable tolerance), as this can be important when comparing the last data set to the one previously stored.

Note that Tests C and D can be implemented so that one chooses the levels of quantities of interest, and then measures the times from switch-off the system takes to reach these levels. However, either way the curves can be recorded until the capacitor discharge current drops to $I_C^*$.

If the SSL system is a part of a larger system, then the controller may report most recently collected data after being queried by a superior circuit through available communication channels (e.g., using wired control, power line communications, or wirelessly via available Wi-Fi, Bluetooth, or other such networks). If the SSL system is isolated, then the controller may be configured to compare the latest values to the first values it measured, and inform the end-user how much useful life is left in the device, based or theoretical analysis and/or historical trends (empirical data, etc).

One way of informing the end-user of an issue is to use small color tunable LED at the housing of the device, which color is controlled by the controller, in accordance with one example embodiment of the present invention. In one such example case, the controller can be configured to set the tunable LED to green if the values are within specified limits, yellow if the limits are crossed but still acceptable, red when the device has so degraded to the point that it requires replacement, and blinking red if the device has failed. The controller may also be configured to send messages to maintenance personnel via an available communications network (e.g., email message, text message, etc).

Numerous variations and configurations will be apparent in light of this disclosure. For instance, one example embodiment of the present invention provides a lighting system. The system includes a switch-off detection circuit configured to detect switch-off time in a switch-mode power supply of a lighting system, and to output a trigger signal in response to detecting switch-off time. The system further includes a controller configured to collect, in response to receiving the trigger signal, data from which conditions of the lighting system can then be assessed for desired performance. In some cases, the conditions of the lighting system to be assessed are with respect to at least one of an output capacitor of the switch-mode power supply and light emitting diodes powered by that supply. In some cases, one or more of the conditions of the lighting system to be assessed are with respect to light emitting diodes (LEDs), and degradation of the LEDs is determined by the controller using at least one of LED threshold voltage $V_{TH}$, LED VI curves, and/or voltage across the LEDs as a function of time. In some cases, one or more of the conditions of the lighting system to be assessed are with respect to an output capacitor of the switch-mode power supply, and degradation of the output capacitor is determined using discharge current of the output capacitor as a function of time. In some cases, the controller is configured to periodically measure voltage associated with light emitting diodes powered by the switch-mode power supply. In some cases, the controller receives its power from a power supply circuit that acts as a constant current drain connected in parallel with an output capacitor of the switch-mode power supply, which current is a known. In some cases, the data collected by the controller includes two voltages $V_1$ and $V_2$ collected by corresponding first and second analog-to-digital converters of the controller, wherein the voltage $V_1$ corresponds to voltage across light emitting diodes of the lighting system and voltage $V_2$ corresponds to output capacitor discharge current of the switch-mode power supply. In some cases, the data collected by the controller allows the controller to compute current through light emitting diodes of the lighting system. In some cases, the system further includes a reporting module for indicating when performance of the lighting system is out of specification. In some cases, the switch-mode power supply includes a flyback or buck-boost topology. In some cases, the trigger signal generated by the switch-off detection circuit causes the controller to start following discharge of an output capacitor of the switch-mode power supply. In some cases, the switch-off detection circuit receives a signal that indicates the switching frequency of the switch-mode power supply, and is configured to at least one of rectify and/or high-pass filter that signal, and to compare the resulting signal to a reference voltage to identify off-states of the switch-mode power supply.

Another embodiment of the present invention provides a lighting system that includes a plurality of light emitting diodes (LEDs), and a switch-mode power supply for providing power to the LEDs, and including an output capacitor. The system further includes a switch-off detection circuit configured to detect switch-off time in the switch-mode power supply, and to output a trigger signal in response to detecting switch-off time. The system further includes a controller configured to collect, in response to receiving the trigger signal, data from which conditions of the lighting system can then be assessed for desired performance. The conditions of the lighting system to be assessed are with respect to at least one of the output capacitor of the switch-mode power supply and the LEDs. In some cases, the controller is configured to assess degradation of the LEDs using at least one of LED threshold voltage $V_{TH}$, LED VI curves, and/or voltage across the LEDs as a function of time. In some cases, the controller is configured to assess degradation of the output capacitor using discharge current of the output capacitor as a function of time. In some cases, the controller receives its power from a power supply circuit that acts as a constant current drain connected in parallel with the output capacitor of the switch-mode power supply, which current is a known. In some cases, the data collected by the controller includes two voltages $V_1$ and $V_2$ collected by corresponding first and second analog-to-digital converters of the controller, wherein the voltage $V_1$ corresponds to voltage across the LEDs and voltage $V_2$ corresponds to output capacitor discharge current of the switch-mode power supply. In some cases, the system further includes a reporting module for indicating when performance of the lighting system is out of specification.

Another embodiment of the present invention provides a lighting system that includes a plurality of light emitting diodes (LEDs), and a switch-mode power supply for providing power to the LEDs, and including an output capacitor. The system further includes a switch-off detection circuit configured to detect switch-off time in the switch-mode power supply, and to output a trigger signal in response to detecting switch-off time, wherein the switch-off detection circuit receives a signal that indicates the switching frequency of the switch-mode power supply, and at least one of rectifies and/or high-pass filters that signal, and compares the resulting signal to a reference voltage to identify off-states of the switch-mode power supply. The system further includes a controller configured to periodically collect, in response to receiving the trigger signal, data from which conditions of the lighting system can then be assessed for desired performance, wherein the data collected by the controller includes two voltages $V_1$ and $V_2$ collected by corresponding first and second analog-to-digital converters of the controller, wherein the voltage $V_1$ corresponds to voltage across light emitting diodes of the lighting system and voltage $V_2$ corresponds to output capacitor discharge current of the switch-mode power supply. The conditions of the lighting system to be assessed are with respect to at least one of the output capacitor of the switch-mode power supply and the LEDs. In some cases, degradation of the LEDs is determined by the controller using at least one of LED threshold voltage $V_{TH}$, LED VI curves, and/or voltage across the LEDs as a function of time, and degradation of the output capacitor is determined using discharge current of the output capacitor as a function of time. In some cases, the controller receives its power from a power supply circuit that acts as a constant current drain connected in parallel with the output capacitor of the switch-mode power supply, which current is a known. In some cases, a reporting module for indicating when performance of the lighting system is out of specification.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A lighting system, comprising:
 a switch-off detection circuit comprising a high-pass filter and a comparator configured to detect switch-off time in a switch-mode power supply of a lighting system, and to output a trigger signal in response to detecting switch-off time; and
 a controller configured to collect, in response to receiving the trigger signal, data from which operating conditions of the lighting system can then be assessed, wherein:
 one or more of the operating conditions of the lighting system to be assessed are with respect to an output capacitor of the switch-mode power supply, and degradation of the output capacitor is determined using discharge current of the output capacitor as a function of time; and
 the data collected by the controller includes two voltages $V_1$ and $V_2$ collected by corresponding first and second analog-to-digital converters of the controller, wherein the voltage $V_1$ corresponds to voltage across light emitting diodes of the lighting system and voltage $V_2$ corresponds to output capacitor discharge current of the switch-mode power supply.

2. The system of claim 1 wherein the operating conditions of the lighting system to be assessed are with respect to at least one of an output capacitor of the switch-mode power supply and the light emitting diodes powered by that supply.

3. The system of claim 1 wherein one or more of the operating conditions of the lighting system to be assessed are with respect to the light emitting diodes (LEDs), and degradation of the LEDs is determined by the controller using at least one of LED threshold voltage $V_{TH}$, LED VI curves, and/or voltage across the LEDs as a function of time.

4. The system of claim 1 wherein the controller is configured to periodically measure voltage associated with the light emitting diodes powered by the switch-mode power supply.

5. The system of claim 1 wherein the controller receives its power from a power supply circuit that acts as a constant current drain connected in parallel with an output capacitor of the switch-mode power supply, which current is a known.

6. The system of claim 1 wherein the data collected by the controller allows the controller to compute current through the light emitting diodes of the lighting system.

7. The system of claim 1 further comprising a reporting module for indicating when performance of the lighting system is out of specification.

8. The system of claim 1 wherein the switch-mode power supply includes a flyback or buck-boost topology.

9. The system of claim 1 wherein the trigger signal generated by the switch-off detection circuit causes the controller to start following discharge of an output capacitor of the switch-mode power supply.

10. The system of claim 1 wherein the switch-off detection circuit receives a signal that indicates the switching frequency of the switch-mode power supply, and is configured to at least one of rectify and/or high-pass filter that signal, and to compare the resulting signal to a reference voltage to identify off-states of the switch-mode power supply.

11. A lighting system, comprising:
 a plurality of light emitting diodes (LEDs);
 a switch-mode power supply for providing power to the LEDs, and including an output capacitor;

a switch-off detection circuit comprising a high-pass filter and a comparator configured to detect switch-off time in the switch-mode power supply, and to output a trigger signal in response to detecting switch-off time; and a controller configured to collect, in response to receiving the trigger signal, data from which operating conditions of the lighting system can then be assessed, wherein the data collected by the controller includes two voltages $V_1$ and $V_2$ collected by corresponding first and second analog-to-digital converters of the controller, wherein the voltage $V_1$ corresponds to voltage across the LEDs and voltage $V_2$ corresponds to output capacitor discharge current of the switch-mode power supply;

wherein the operating conditions of the lighting system to be assessed are with respect to at least one of the output capacitor of the switch-mode power supply and the LEDs.

12. The system of claim 11 wherein the controller is configured to assess degradation of the LEDs using at least one of LED threshold voltage $V_{TH}$, LED VI curves, and/or voltage across the LEDs as a function of time.

13. The system of claim 11 wherein the controller is configured to assess degradation of the output capacitor using discharge current of the output capacitor as a function of time.

14. The system of claim 11 wherein the controller receives its power from a power supply circuit that acts as a constant current drain connected in parallel with the output capacitor of the switch-mode power supply, which current is a known.

15. The system of claim 11 further comprising a reporting module for indicating when performance of the lighting system is out of specification.

16. A lighting system, comprising:
a plurality of light emitting diodes (LEDs);
a switch-mode power supply for providing power to the LEDs, and including an output capacitor;
a switch-off detection circuit configured to detect switch-off time in the switch-mode power supply, and to output a trigger signal in response to detecting switch-off time, wherein the switch-off detection circuit receives a signal that indicates the switching frequency of the switch-mode power supply, a high-pass filter of the switch-off detection circuit filters that signal, and a comparator of the switch-off detection circuit compares the resulting signal to a reference voltage to identify off-states of the switch-mode power supply; and
a controller configured to periodically collect, in response to receiving the trigger signal, data from which operating conditions of the lighting system can then be assessed, wherein the data collected by the controller includes two voltages $V_1$ and $V_2$ collected by corresponding first and second analog-to-digital converters of the controller, wherein the voltage $V_1$ corresponds to voltage across light emitting diodes of the lighting system and voltage $V_2$ corresponds to output capacitor discharge current of the switch-mode power supply;
wherein the operating conditions of the lighting system to be assessed are with respect to at least one of the output capacitor of the switch-mode power supply and the LEDs.

17. The system of claim 16 wherein degradation of the LEDs is determined by the controller using at least one of LED threshold voltage $V_{TH}$, LED VI curves, and/or voltage across the LEDs as a function of time, and degradation of the output capacitor is determined using discharge current of the output capacitor as a function of time.

* * * * *